(12) United States Patent
Khandan et al.

(10) Patent No.: US 6,342,453 B1
(45) Date of Patent: Jan. 29, 2002

(54) METHOD FOR CVD PROCESS CONTROL FOR ENHANCING DEVICE PERFORMANCE

(75) Inventors: Shahab Khandan, Pleasanton; Christopher T. Fulmer, San Jose; Lori D. Washington, Union City; Herman P. Diniz, Fremont; Lance A. Scudder, Santa Clara; Arkadii V. Samoilov, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/454,423

(22) Filed: Dec. 3, 1999

(51) Int. Cl.[7] .................. H01L 21/31; H01L 21/469
(52) U.S. Cl. ............ 438/758; 438/14; 438/37; 438/680; 427/8; 427/248.1; 427/256
(58) Field of Search .................. 438/14, 37, 758, 438/680; 427/8, 248.1, 256

(56) References Cited

U.S. PATENT DOCUMENTS

| | | | | |
|---|---|---|---|---|
| 4,859,277 A | * | 8/1989 | Barna et al. ............. | 156/626 |
| 5,254,369 A | * | 10/1993 | Arai et al. ............. | 427/248.1 |
| 5,695,819 A | * | 12/1997 | Beinglass et al. ......... | 427/255 |
| 5,783,839 A | * | 7/1998 | Morikawa et al. ......... | 257/21 |

* cited by examiner

Primary Examiner—John F. Niebling
Assistant Examiner—David A Zarneke
(74) Attorney, Agent, or Firm—Blakely Sokoloff Taylor & Zafman

(57) ABSTRACT

A method and system for controlling the introduction of a species according to a determined concentration profile of a film comprising the species introduced on a substrate. In one aspect, the method comprises controlling the flow rate of a species according to a determined concentration profile of a film introduced on a substrate, and introducing a film on a substrate, the film comprising the species at a first concentration at a first point in the film and a second concentration different than the first concentration at a second point in the film. Also, a bipolar transistor including a collector layer of a first conductivity type, a base layer of a second conductivity type forming a first junction with the collector layer, and an emitter layer of the first conductivity type forming a second junction with the base layer. An electrode configured to direct carriers through the emitter layer to the base layer and into the collector layer is also included. In one embodiment, at least one of the first junction and the second junction is between different semiconductor materials to form at least one heterojunction. The heterojunction has a concentration profile of a semiconductor material such that an electric field changes in an opposite way to that of a mobility change.

12 Claims, 8 Drawing Sheets

METHOD FOR CVD PROCESS CONTROL FOR ENHANCING DEVICE PERFORMANCE

BACKGROUND OF THE INVENTION

1. Field of the Invention

The invention relates to semiconductor processing techniques, more particularly, to controlling constituents of a film introduced onto a substrate.

2. Description of Related Art

In the formation of modern integrated circuit devices, many constituents are introduced to a substrate such as a wafer to form films. Typical films include dielectric material films, such as transistor gate oxide or interconnect isolation films, as well as conductive material or semiconducting material films. Interconnect metal films and polysilicon electrode films, respectively, are examples of conductive and semiconducting material films.

In addition to the above-noted material films, other constituents are often introduced onto a substrate such as a wafer or a structure on a substrate to change the chemical or conductive properties of the substrate or the structure. Examples of this type of constituent introduction includes, for example, the deposition of a refractory metal onto an electrode or junction to form a silicide and the deposition of germane onto a substrate to form a silicon germanium junction in a bipolar transistor. The introduction of constituents onto a substrate or structure on a substrate such as described is referred to herein as a subset of film formation.

One way to enhance the performance of integrated circuit devices is to improve control of the introduction of the constituents, such as improved control of the introduction of process gas species in deposition introduction. Many wafer process chambers, including the EPI Centura system, commercially available from Applied Materials, Inc. of Sunnyvale, Calif., utilize mass flow controllers to introduce process gas species. In general, a mass flow controller functions by permitting a desired flow rate of a gas species based on an input signal to the mass flow controller demanding the flow rate. The concentration profile of a species constituent within a film deposited on a substrate is then a function of the mass flow rate of species introduced. In general, the relationship between a species concentration profile or gradient introduced into or onto a substrate, for example a wafer, and the mass flow rate of the species introduced is not necessarily linear.

In general, mass flow controllers are used to either supply a constant flow rate or a variable flow rate from a first flow set point to a second flow set point over a period of time. One common flow ramp between a first set point and a second set point is a linear flow ramp. A linear ramp, however, does not necessarily produce a desired concentration profile, e.g., a linear profile, of the species in the introduced film. In the example of a species of germane ($GeH_4$) introduced to form a silicon-germanium film, a graded film is desirable in many situations. The desired graded profile in the film, for example germanium concentration profile, may be linear or non-linear. The method to control a mass flow controller to precisely control the amount of flow and produce the desired germanium concentration profile in the junction, whether it is linear or non-linear, is of significant importance. In commercial use, targeting a desired concentration profile, for example a linear profile, has generally not proved possible through a linearly increasing or decreasing constant flow introduction of the germanium species by a mass flow controller.

What is needed is a way to control the introduction of a species to form a film having a desired concentration profile of the species in the film. The ability to quantitatively control the introduction of a species through a mass flow controller to form a film with a specific film thickness is also desirable.

SUMMARY OF THE INVENTION

A method and system for controlling the introduction of a species of a film comprising the species introduced on a substrate is disclosed. In one aspect, the method comprises controlling the flow rate of a species according to a determined graded concentration profile of a film introduced on a substrate, and introducing a film on a substrate, the film comprising the species at a first concentration at a first point in the growth of the film and a second concentration different than the first concentration at a second point in the growth of the film. In one embodiment, the concentration profile used to control the flow rate is established by experimentally determining a concentration of the species introduced on a substrate for a first plurality of flow rates and determining an introduction rate, e.g., a growth rate, of the species introduced, e.g., grown on a substrate. According to the invention, more accurate control of a species concentration in a formed film can be obtained over prior art methods. The invention also offers the ability to control the amount or the thickness of a film formed on a substrate.

A bipolar transistor is also disclosed. In one embodiment, the bipolar transistor includes a collector layer of a first conductivity type, a base layer of a second conductivity type forming a first junction with the collector layer, and an emitter layer of the first conductivity type forming a second junction with the base layer. An electrode configured to direct carriers through the emitter layer to the base layer and into the collector layer is also included. In this embodiment, at least one of the first junction and the second junction is between different semiconductor materials to form at least one heterojunction. The heterojunction has a concentration profile of a semiconductor material such that an electric field changes in an opposite way to that of a mobility change.

DETAILED DESCRIPTION OF THE INVENTION

A method and a system for the controlled introduction of a species to a substrate are disclosed. In one embodiment, the method includes controlling the flow rate of a species into a chamber according to determined concentration and introduction rate profiles to introduce (e.g., deposit) a film on a substrate in the chamber. The determined concentration and introduction rate profiles may be established through experimental data related to a concentration of a species in a formed film according to a plurality of selected flow rates of the species constituent (hereinafter "species") into the chamber. This information is utilized to adjust the introduction rate of a species per unit time to form a film having a desired concentration profile as well as a desired thickness.

Figure 1:
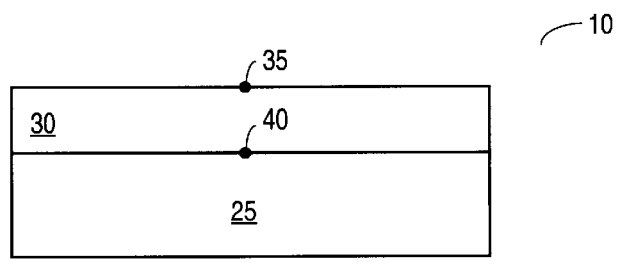
FIG. 1 schematically illustrates a side view of a portion of a substrate having a film with a graded concentration profile introduced according to an embodiment of the invention.

FIG. 1 shows a side view of a portion of a semiconductor substrate having a silicon germanium ($Si_{1-x}Ge_x$) epitaxially-introduced film thereon. Structure 10 includes substrate 25 that is, for example, a silicon semiconductor wafer with $Si_{1-x}Ge_x$ film 30 introduced on a surface thereof. $Si_{1-x}Ge_x$ film 30, in this embodiment, has a graded concentration profile of germanium (Ge), represented by concentration points 35 and 40. Concentration points 35 and 40 represent, for example, two of many concentration points. In one example, the concentration profile from concentration point 35 to concentration point 40 is desired to be linear with the highest concentration of Ge present at concentration point 40 and the lowest concentration at concentration point 35. In one example, the concentration profile of Ge in $Si_{1-x}Ge_x$ film 30 varies linearly from a concentration of approximately zero percent Ge at concentration point 35 to a concentration of 20 percent Ge at concentration point 40.

Figure 2:
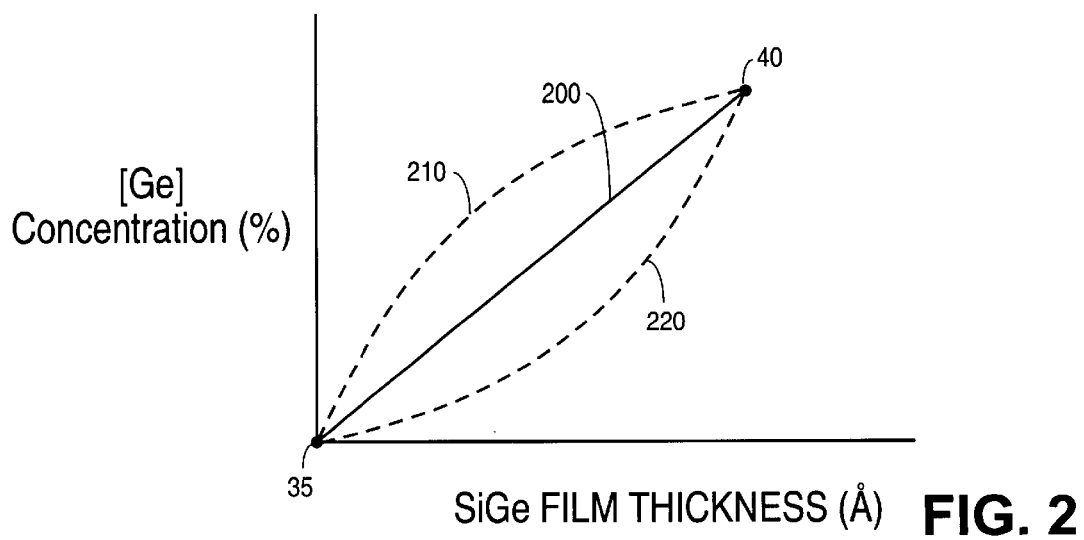
FIG. 2 illustrates the concentration gradient of a germanium species in a film according to an embodiment of the invention.

FIG. 2 graphically represents the concentration profile of germanium in $Si_{1-x}Ge_x$ film 30 of FIG. 1. In this representation, the concentration profile is measured from the surface of the film (represented by concentration point 35) to the silicon-$Si_{1-x}Ge_x$ film interface (represented by concentration point 40). Thus, the film thickness is measured from the surface of film 30 to the interface of film 30 and substrate 25. In one example, denoted by the solid line, the concentration profile varies in a linear fashion through the film. It is to be appreciated that the invention method and system is capable of producing a variety of concentration profiles, including non-linear profiles such as profile 210 and profile 220 in FIG. 2.

Figure 3:
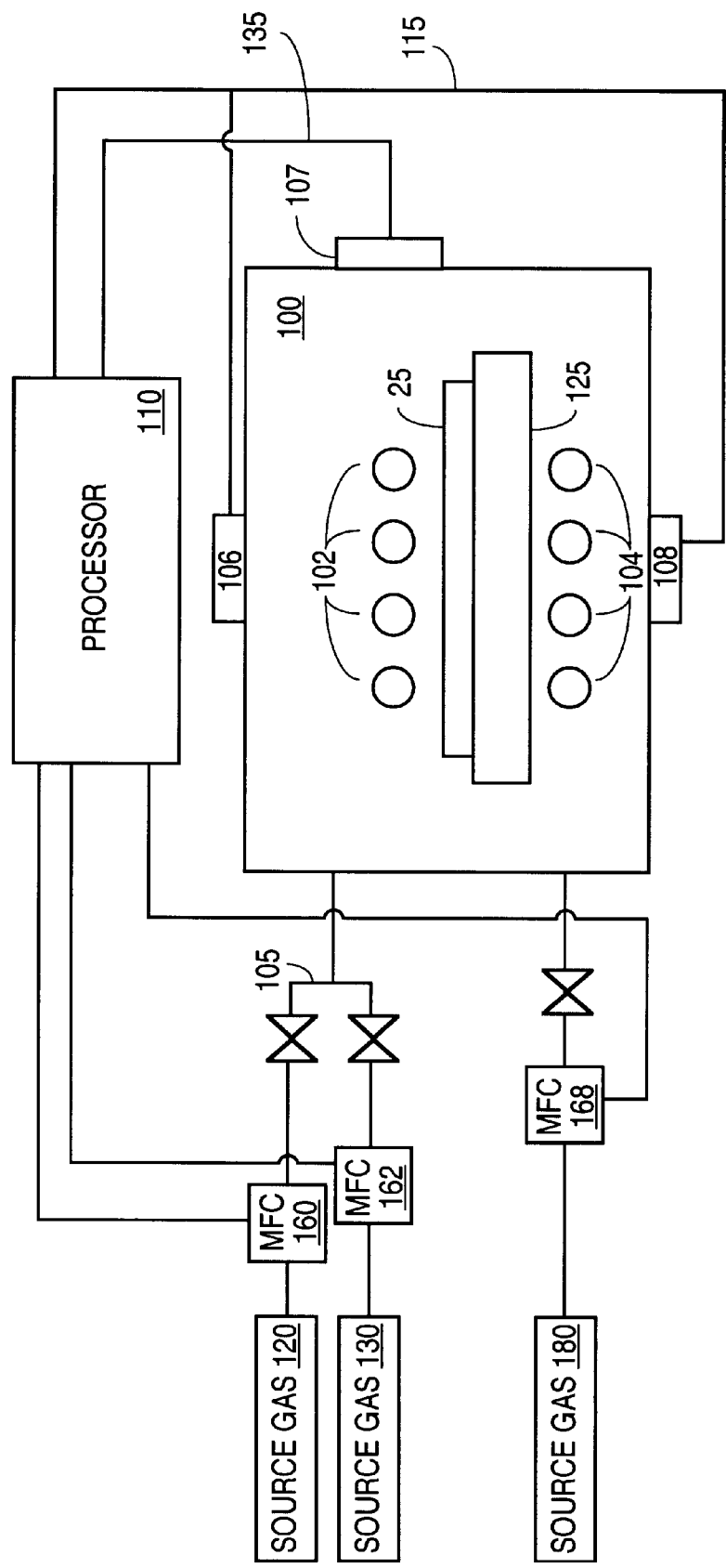
FIG. 3 illustrates a schematic view of an embodiment of a system for introducing a species to a substrate according to the invention.

FIG. 3 is an example of a process environment utilizing a system of the invention to introduce a species to form a film such as film 30 on substrate 25 of FIG. 1. In this embodiment, an EPI Centura system, commercially available from Applied Materials, Inc. of Sunnyvale, Calif., modified according to the invention is described. It is to be appreciated that the system is not limited to an EPI Centura system but can be accommodated in other systems, particularly where a mass flow controller is utilized to introduce a species into a reaction chamber. A $Si_{1-x}Ge_x$ chemical vapor deposition (CVD) film formation process is also described. Similarly, it is to be appreciated that the invention is not limited to CVD $Si_{1-x}Ge_x$ film formation systems but will apply to other systems and methods, particularly where a species is introduced into a chamber to form a film.

Referring to FIG. 3, the system includes chamber 100 that accommodates substrate 25, such as a semiconductor wafer, for processing. Substrate 25 is seated on stage 125 that is, in one embodiment, a susceptor plate. Heating lamps 102 and 104 are used to heat substrate 25. Processor 110 controls the temperature and pressure inside chamber 100. The temperature is measured via, for example, pyrometers 106 and 108 coupled to the chamber. Similarly, the pressure may be monitored by one or more pressure sensors, such as BARATRON® pressure sensors, commercially available from MKS Instruments of Andover, Mass. and regulated by a pressure control value. In the schematic illustration shown in FIG. 3, pyrometer 106 and pyrometer 108 are coupled to processor 110 through signal line 115. Processor 110 uses received information about the substrate temperature to control heat lamps 102 and 104. The one or more pressure sensors are coupled to processor 110 through signal line 135. Processor 110 uses received information about the chamber pressure to control the pressure through, for example, controlling a vacuum source and a pressure control value coupled to the chamber.

Processor 110 also controls the entry of constituents into chamber 100. In one embodiment, the system includes at least two source gases 120 and 130 coupled to manifold 105. Processor 110 controls the introduction of each of source gas 120 and source gas 130, as desired, through manifold 105 and controls the flow of the source gas or gases through mass flow controllers 160 and 162, respectively. For use in a $Si_{1-x}Ge_x$ film formation process, mass flow controller 160 is, for example, a one standard liter per minute (SLM) of silane ($SiH_4$) unit and mass flow controller 162 is a 150 standard cubic centimeters per minute (sccm) of germane ($GeH_4$) unit. Processor 110 also controls the introduction of a process gas (source gas 180), such as for example, nitrogen ($N_2$) or hydrogen ($H_2$), through mass flow controller 168 as known in the art. Each mass flow controller is, for example, a unit commercially available from UNIT Instruments, Inc. of Yorba Linda, Calif.

In one embodiment, processor 110 controls the introduction of a source gas to form a $Si_{1-x}Ge_x$ film on substrate 25, such as $Si_{1-x}Ge_x$ film 30 in FIG. 1. Source gas 120 is, for example, the constituent silane ($SiH_4$) and source gas 130 is, for example, the constituent germane ($GeH_4$). In this embodiment, one goal is to introduce a film having a concentration gradient of the species germanium (Ge) through the thickness of the $Si_{1-x}Ge_x$ film. Still further, this gradient is desired, in one embodiment, to be linear between a concentration of Ge at a surface of the film (concentration point 35 of FIG. 1) of zero percent and a maximum at an interface between the silicon wafer and the film (concentration point 40 of FIG. 1).

In general, mass flow controllers, such as mass flow controller 160 and mass flow controller 162, can vary (e.g., increase or decrease) the flow rate change of a species introduced into a chamber. The concentration change of a species such as Ge over a thickness of a film may be accomplished at the mass flow controller by changing the flow rate of the source gas into chamber 100. For any measurable control, this flow rate change is generally linear. However, a linear flow rate change, for example, from higher to lower mass flow and thus lower introduction amount of species, does not necessarily produce a linear concentration gradient of the species in the formed film. This is particularly the case with the constituent $GeH_4$, where a linear increase or decrease of flow rate does not generally result in a linear change in concentration of the species constituent Ge in the formed film. Instead, a concentration profile of Ge in a formed film generally more closely resembles the convex profile represented by dashed line 210. According to the invention, however, a concentration profile such as represented by line 200 may be obtained by controlling mass flow controller 162 to introduce source gas 130 at a non-linear rate.

Figure 4:
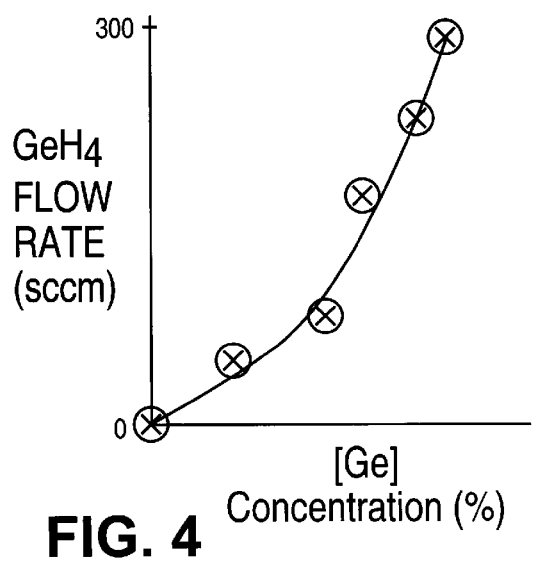
FIG. 4 illustrates a curve fit of the experimentally-determined concentration of germanium of a film introduced according to six discrete germane flow rates and a constant silane flow rate.

In an embodiment of the invention, a method is presented wherein a desired concentration profile of the species, including the linear concentration profile illustrated in FIG. 2 (line 200), is produced. According to this method, experimental determinations of the concentration of a species such as Ge is measured in a film formed according to a plurality of flow rates of the constituent $GeH_4$ through mass flow controller 162 on a sacrificial wafer. In one embodiment, the concentration of Ge in a film formed on a wafer is measured for six discrete flow rates of $GeH_4$ through mass flow controller 162. Each experimental measurement corresponds to a single unit of film introduced on a wafer by introducing a constant flow rate of $GeH_4$ through mass flow controller 162. In one embodiment, six concentrations of Ge in six discrete films introduced by six discrete $GeH_4$ flow rates through mass flow controller 162 on six wafers are measured. Each film is analyzed for species Ge concentration through analytical methods such as Secondary Ion Mass Spectroscopy (SIMS), x-ray diffraction, or ellipsometry. The six discrete flow rates are plotted versus the Ge concentration in a corresponding film as illustrated in FIG. 4. In this example, a single experimental measurement is obtained from a film on a single wafer by placing a sacrificial wafer in chamber 100 and the reaction conditions of the chamber established. In one embodiment, a film is formed at a chamber pressure of 100 Torr and a temperature of 680° C. In one example, process gas is introduced in chamber 100 according to the following flow rate recipe:

| Source Gas | Constituent | Flow Rate |
|---|---|---|
| 120 | $SiH_4$ | 1 SLM |
| 130 | $GeH_4$ | varied |
| 180 | $H_2$ | 30 SLM |

It is to be appreciated, that other recipes may be utilized to introduce the films on the wafers. Such recipes will generally depend on the desired process parameters. For example, in the introduction of a $Si_{1-x}Ge_x$ film, additional constituents such as hydrochloric acid (HCl), may be added to modify the properties of the film. One objective in collecting the experimental data is to mimic the desired process conditions as closely as possible.

According to the above recipe, six flow rates of source gas 130 of the constituent $GeH_4$ are selected between 0 and 300 sccm. It is to be appreciated that $GeH_4$ flow rates higher than 300 sccm can be selected. One limit of $GeH_4$ flow may be considered as one beyond which the Ge concentration in the introduced film will not further increase for an increase in the $GeH_4$ flow rate. A corresponding concentration of Ge is measured in a film formed on the sacrificial wafer. Once the data is collected, a curve is established through a curve fit algorithm such as a Gauss-Jurdan algorithm. FIG. 4 illustrates the curve fit for six points. In one example, a Gauss-Jurdan numerical algorithm is used to calculate the coefficients of a third order polynomial that best fits the six experimental measurements. This method of curve fitting is known as the Least Square Fit (LSF) method of curve fit. It is to be appreciated that the Gauss-Jurdan numerical algorithm is not the only method to calculate coefficients of an LSF polynomial. Similarly, the LSF method as well as the Gauss-Jurdan method are not limited to six data points but may be used, for example, with as few as three data points or more than six data points.

Figure 5:
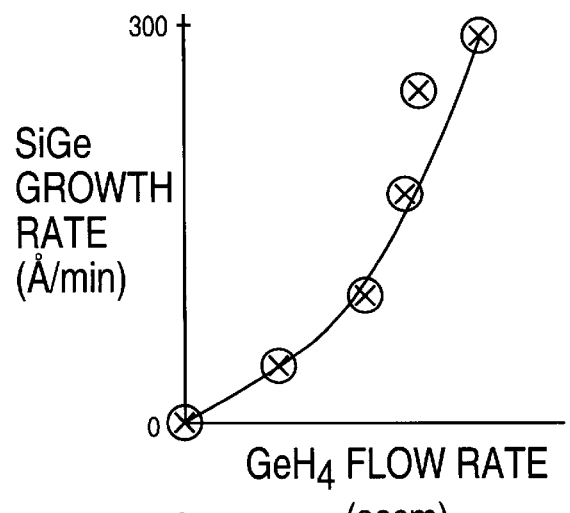
FIG. 5 illustrates the experimentally-determined growth rate of silicon germanium in a film introduced on a substrate for six discrete germane flow rates and a constant silane flow rate.

According to an embodiment of the invention, the flow rate of $GeH_4$ (e.g., six discrete flow rate measurements) is also measured against the introduction rate, e.g., growth rate, of the $Si_{1-x}Ge_x$ film introduced on the sacrificial wafer. It is to be appreciated that the same six flow rates as utilized in FIG. 4 may be utilized to compare the growth rate of $Si_{1-x}Ge_x$. In one embodiment, the experimentally-obtained $Si_{1-x}G_e$ growth rates are measured from the same film grown on the same six sacrificial wafers used to measure Ge concentration. FIG. 5 shows a plot of $GeH_4$ flow rate versus $Si_xGe_{1-x}$ growth rate and a curve fit through the plotted points. The same numerical method of LSF is used to determine the best curve fit to the experimentally-obtained growth rate measurements. The coefficients of the third order polynomial are calculated using, for example, the Gauss-Jurdan method noted above with respect to FIG. 4.

The experimentally-determined data for concentration of a species as a function of flow rate and the experimentally-determined data for growth rate as a function of flow rate is input into processor 110. Also, a desired Ge concentration profile as a function of the $Si_{1-x}Ge_x$ film thickness is input into processor 110. For example, $Si_{1-x}Ge_x$ film 30 in FIG. 1 is formed for input germanium concentrations of 20% at point 40 and 0% at point 35 having a linear change in concentration from point 40 to point 35 over a 500 Angstroms $Si_{1-x}Ge_x$ input film thickness identified as film 30.

When wafer 10 is placed in processor 110, processor 110 first calculates the curves of FIGS. 4 and 5 using the six experimentally determined measures for concentration and growth rate. Processor 110 next uses the desired input concentration profile over the desired growth thickness as a guide to calculate the set points for $GeH_4$ mass flow controller 162. For a desired Ge concentration, the corresponding $GeH_4$ flow rate is calculated from FIG. 4. This flow rate is then used to calculate the $Si_{1-x}Ge_x$ growth rate, from FIG. 5. The corresponding growth rate used along with a selected time interval ($\Delta t$) establishes the desired growth thickness of a portion of $Si_{1-x}Ge_x$ film for the time interval. The thickness of the $Si_{1-x}Ge_x$ grown within a selected time interval is subtracted from the total desired film thickness to establish the thickness left to be grown. Using the new thickness that yet needs to be grown, the desired input concentration profile as a function of thickness is used to calculate a corresponding new $Si_{1-x}Ge_x$ concentration value. Using the new concentration value, the above process of using the data from FIGS. 4 and 5 will be repeated to calculate a new thickness of $Si_{1-x}Ge_x$ grown for a second time interval, $\Delta t$. This iterative process will continue until the total desired thickness of $Si_{1-x}Ge_x$ is on wafer 10.

In one example, a $Si_{1-x}G_x$ film has a Ge concentration of 20 percent at the wafer film interface (concentration point 40) and zero at the film surface (concentration point 35). In this example, a linear concentration profile is desired. Given the desired concentration (e.g., 20 percent), the data obtained from FIG. 4 is queried to obtain the desired flow rate of $GeH_4$ species through mass flow controller 162 (flow as a function of concentration). Once the flow is established, the data collected and represented by FIG. 5 is utilized to calculate a growth rate for the desired flow (growth rate as a function of flow rate). For a predetermined time interval (e.g., 0.2 seconds), the amount of film 30 introduced on substrate 25 during a time interval of 0.2 seconds may be determined for the desired concentration. Thus, by using the experimental data and a predetermined time interval, the concentration in a $Si_{1-x}Ge_x$ film and a film thickness is known.

In the example where a linear variance in concentration is desired, such as illustrated by line 200 in FIG. 2, a corresponding concentration is determined for a second time interval. Thus, in reference to FIG. 2, knowing the concentration profile as a function of film thickness and starting from a desired concentration point of film 30, subsequent concentration points along the path of line 200 may be calculated for time intervals, $\Delta t$. In one embodiment, a time interval of 0.2 seconds is used to control mass flow controller 162 and the corresponding $GeH_4$ flow rate (FIG. 4) as well as growth rate (FIG. 5) is calculated to obtain a linear profile (line 200). The process continues until a desired film thickness of film 30 is formed.

Processor 110 contains, in one embodiment, a suitable algorithm to calculate the desired flow rate of a constituent to mass flow controller 162 as a function of concentration. Processor 110 also contains, in this embodiment, a suitable algorithm to calculate a growth rate as a function of flow rate. For example, processor 110 is supplied with software instruction logic that is a computer program stored in a computer-readable medium such as memory in processor 110. The memory is, for example, a hard disk drive. Additional memory associated with processor 110 stores, among another items, the experimentally determined data of concentration of the constituent species over a desired flow rate spectrum (FIG. 4), and experimentally-determined data related to the growth rate of the constituent species over the desired flow rate spectrum (FIG. 5) as well as the corresponding curve fit algorithms.

Figure 6:
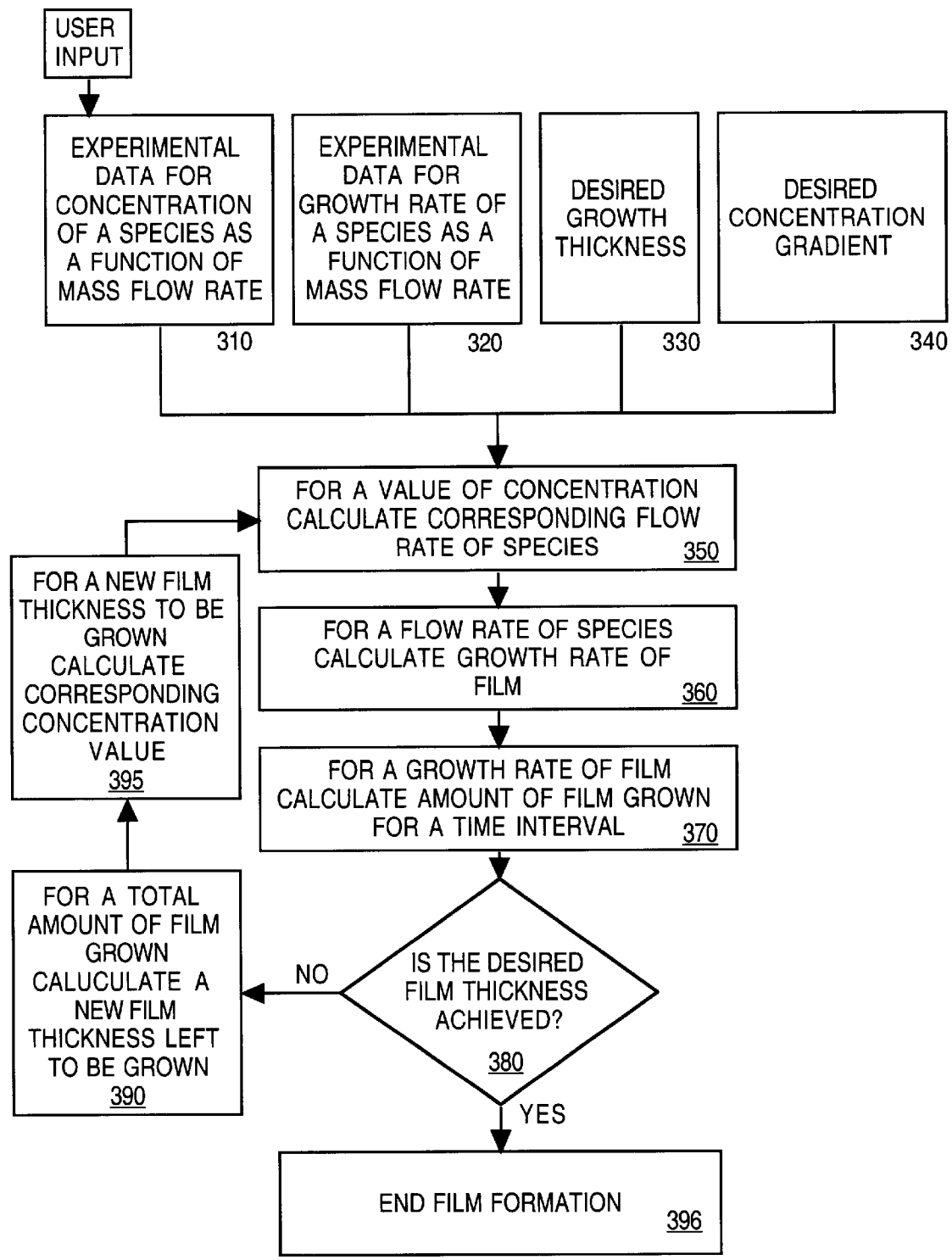
FIG. 6 illustrates a block diagram for the introduction of a germanium species to a substrate in accordance with an embodiment of the invention.

FIG. 6 shows an illustrative block diagram of the hierarchical structure of system logic according to one embodiment of the invention for forming a film having a desired concentration profile and thickness on a substrate which is a wafer. Such control logic would constitute a program to be run on processor 110. A suitable programming language for such a program includes, but is not limited to, C, C++, and other languages. The program may be supplied directly on processor 110 or to processor 110 by way of an outside device, such as a computer.

As a first operation, certain user inputs are supplied to processor 110 and stored in the form of either internal or external memory. The information supplied to processor 110 for the system logic includes experimental data for introduction rate, e.g., concentration of a species such as Ge concentration as a function of mass flow rate (block 310), experimental data for growth rate of an introduced film, such as $Si_{1-x}Ge_x$, as a function of mass flow rate (block 320), the desired thickness of a film on a substrate, such as a $Si_xGe_{1-x}$ film on a wafer (block 330), and the desired concentration profile of a film formed on a substrate such as a wafer (block 340).

Once the above-described data is supplied to processor 110, the system logic calculates a flow rate of a species, such as $GeH_4$, for a value of concentration desired by the user (block 350) for a predetermined time interval. System logic is then used to control mass flow controller 162 to regulate the corresponding flow rate of source gas 130 of $GeH_4$.

In addition to calculating a corresponding flow rate of a species for a desired concentration, the system logic calculates an introduction rate, e.g., a growth rate, of a corresponding film on a substrate, such as a wafer for the calculated flow rate (block 360). For a calculated growth rate of film, an amount of film can further be calculated for a given time interval (block 370). This information is used by processor 110 to introduce a constituent, such as $GeH_4$, through mass flow controller 162 to introduce a film on substrate 25 for a selected time interval. 0.2 seconds is an example of a desired time interval as 0.2 seconds represents the time interval utilized for ramp-up or ramp-down of flow through a mass flow controller, for example, a UNIT mass flow controller used in an EPI Centura system.

Once a constituent is introduced into chamber 100 to form a portion of film 30 according to the method described herein for a predetermined time interval, the system logic determines whether the desired film thickness is achieved by comparing the calculated film thickness with the desired film thickness (block 380). If the desired input film thickness with the desired input concentration profile has not been achieved, the system logic of processor 110 calculates a new value for film thickness representing the additional thickness amount needed to obtain the total desired input thickness (block 390), and calculates the corresponding desired input concentration value for the newly calculated thickness (block 395). Processor 110 returns to block 350 and uses the newly calculated value of desired concentration to calculate a corresponding flow rate. Processor 110 continues this process until a desired film thickness is achieved. Once a desired film thickness is achieved, the system logic discontinues the loop and completes the film formation (block 396). It is to be appreciated that calculations of flow rates and film growth may precede the introduction of a constituent into the chamber.

Figure 7:
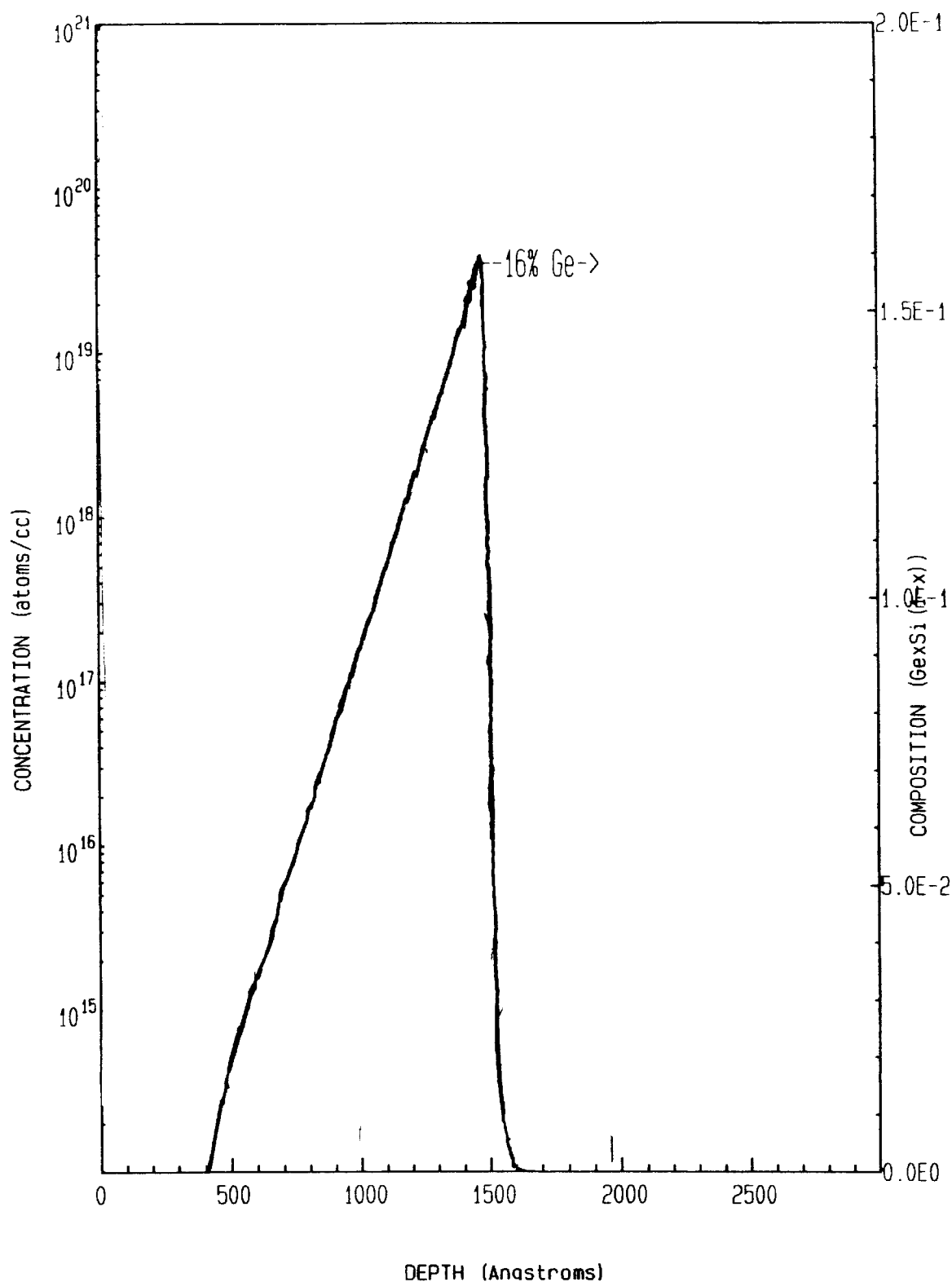
FIG. 7 is a Secondary Ion Mass Spectroscopy (SIMS) profile of an epitaxial silicon-germanium film introduced according to the invention to have a linearly graded profile of germanium.

According to the method and system described, a film-forming constituent can be controlled, through control of a mass flow controller, to achieve a desired concentration profile of a species in a film and a desired film thickness introduced on a substrate, such as a wafer. In the above embodiment, a method of achieving a linear concentration profile is described. FIG. 7 shows a SIMS profile of a epitaxially grown $Si_{1-x}Ge_x$ film on a silicon substrate having a linear concentration profile of Ge introduced according to a method of the invention. The SIMS profile illustrates the atomic profile of Ge from the surface (0 depth) to the interface of the $Si_{1-x}Ge_x$ and the silicon substrate. Thus, the depth represents the depth into the $Si_{1-x}Ge_x$ film.

In FIG. 7, the thickness of the $Si_{1-x}Ge_x$ film is approximately 1000 Å. The concentration at the surface of the film is zero (represented as beginning at a depth of approximately 500 Å to account for a cap on the SIMS system). The concentration profile through the film is linear to a Ge concentration of 16 percent at the $Si_{1-x}Ge_x$/silicon interface.

Figure 8:
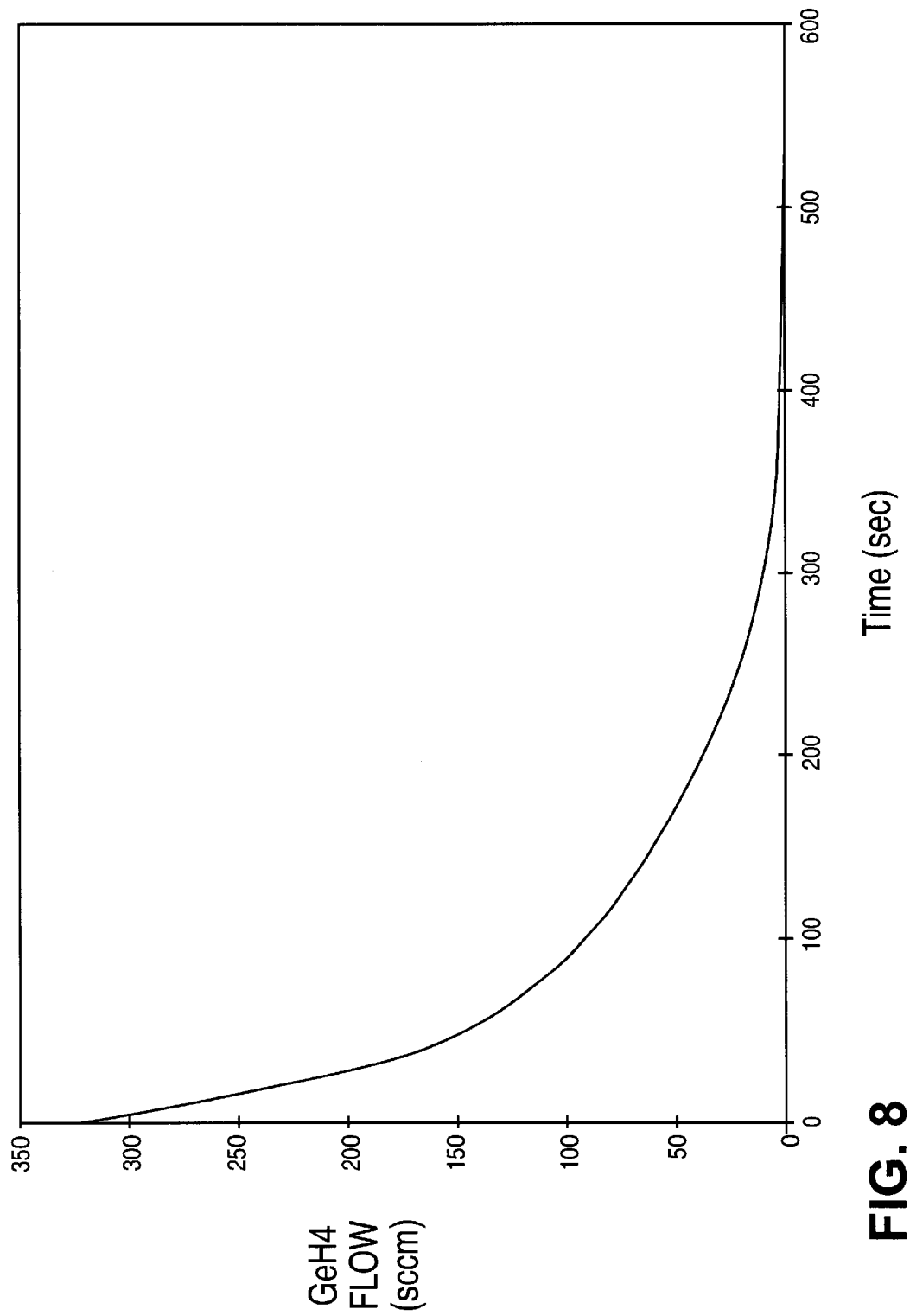
FIG. 8 is the flow rate of germane ($GeH_4$) per unit time to produce the graded profile of FIG. 7.

FIG. 8 shows a plot of the flow rate of $GeH_4$ introduced to produce the linear Ge profile illustrated in FIG. 7. FIG. 8 illustrates that a linear concentration profile is formed but the flow rate of $GeH_4$ that produced the profile is varied in a non-linear fashion.

It is to be appreciated that the principles of the invention are not limited to a method and system for introducing a film having a linear concentration profile of a species constituent, but are equally applicable to situations where a non-linear concentration profile is desired. For example, a profile such as illustrated by lines 210 and 220 in FIG. 2 or other profile may be desired. In one aspect, the invention provides a technique for controlling a mass flow controller to achieve a desired concentration profile in a film introduced on a substrate.

Figure 9:
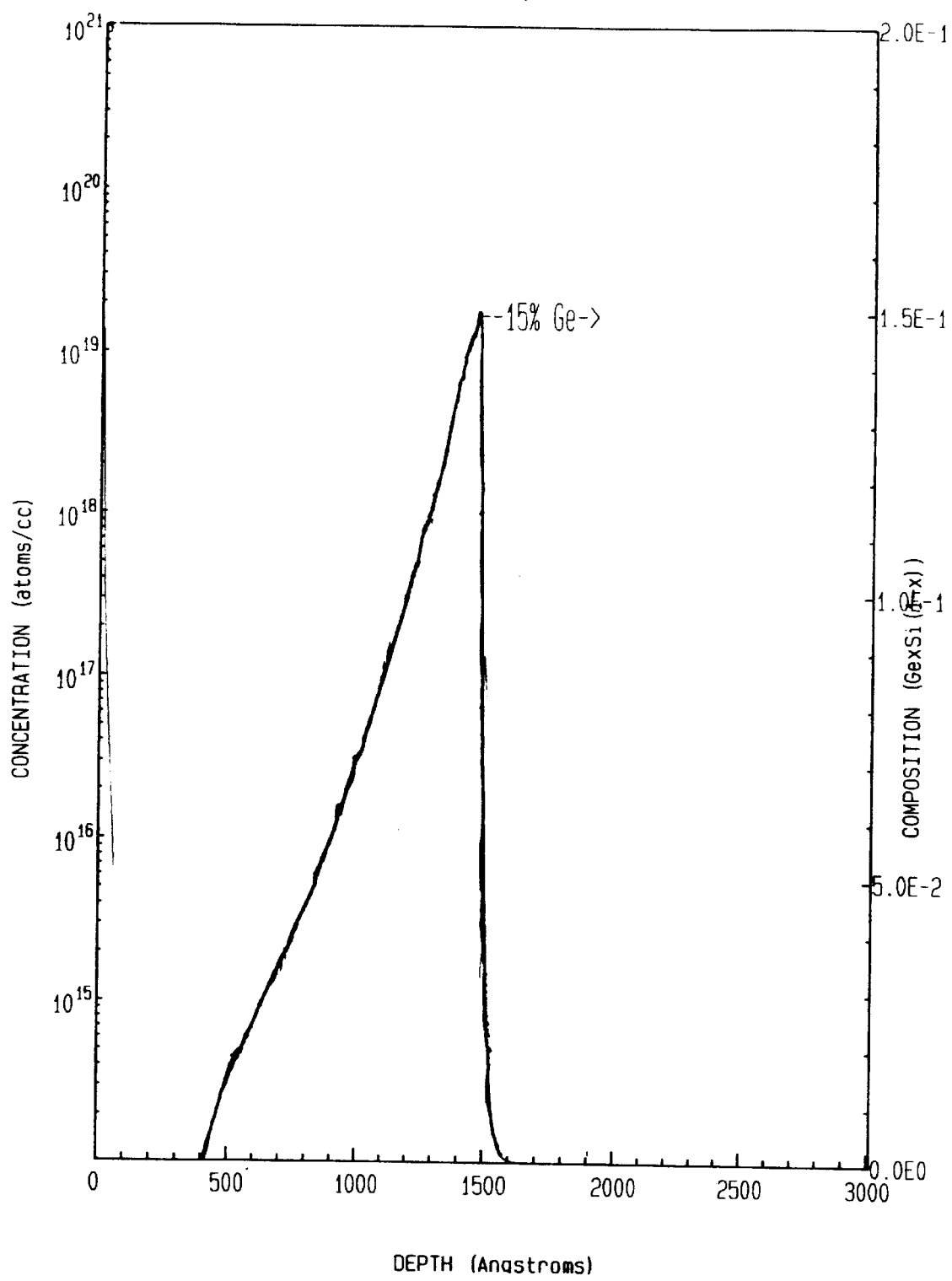
FIG. 9 is a SIMS profile of an epitaxial silicon-germanium film introduced according to the invention to have a concave graded profile of germanium.

FIG. 9 shows a film profile of epitaxially grown silicon-germanium film on a silicon substrate having a concave concentration profile of Ge formed according to a method of the invention. Similar to FIG. 7, the film's profile illustrates the atomic profile of Ge from the surface (zero depth) to the interface of the $Si_{1-x}Ge_x$ and the silicon substrate. The thickness of the silicon-germanium film is approximately 1000 Å. The concentration profile adapts a concave representation from a Ge concentration of zero percent at the surface of the film to a concentration of 15 percent at the interface.

Figure 10:
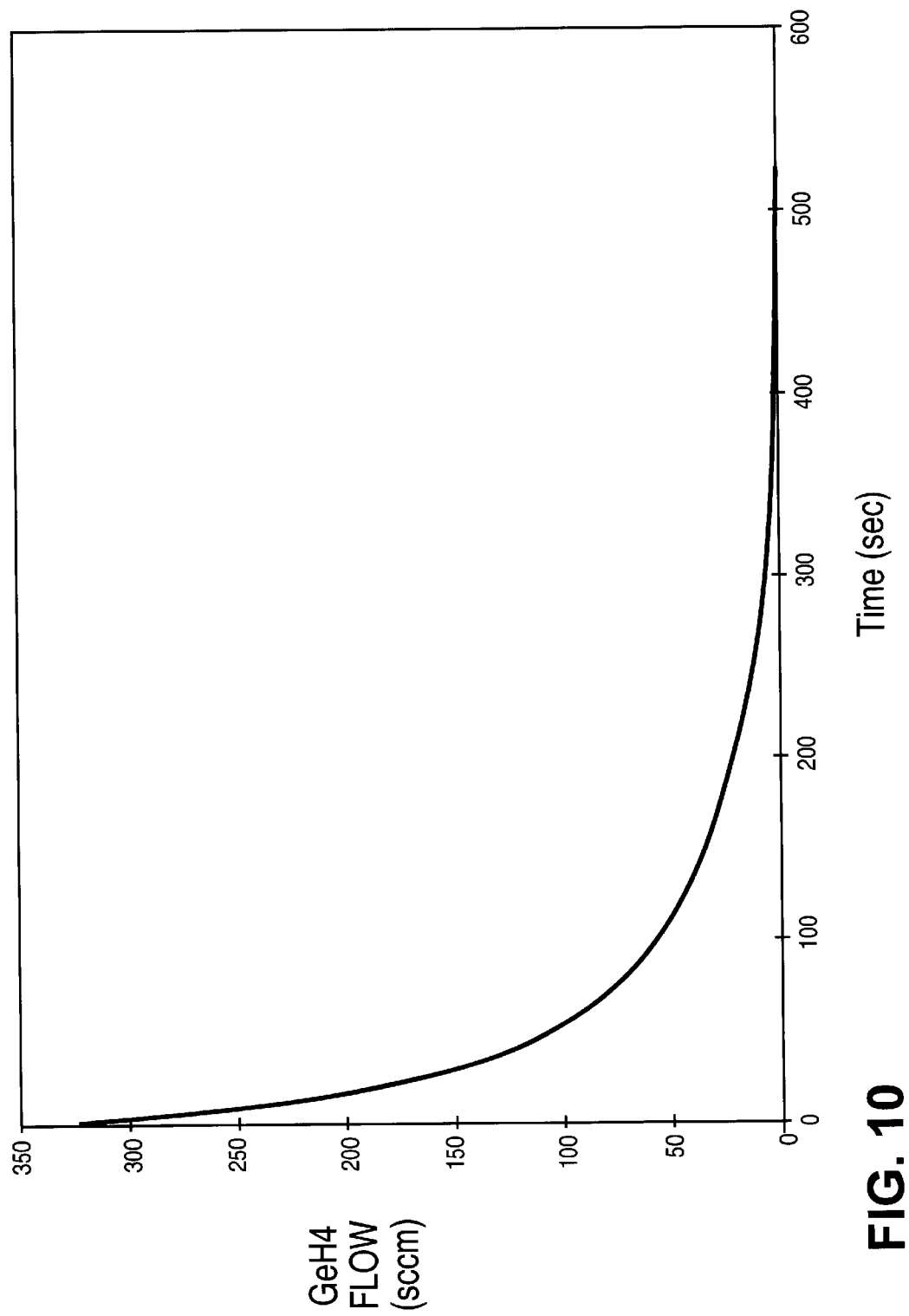
FIG. 10 is the flow rate of $GeH_4$ per unit time to produce the graded profile of FIG. 9.

FIG. 10 shows a plot of the flowchart of GeH4 introduced to produce the profile illustrated in FIG. 9. FIG. 10 illustrates that the concave profile produced in FIG. 9 is not the result of a linear change in the flow rate of $GeH_4$.

In addition to providing the ability to establish a desired concentration profile of a film introduced on a substrate, such as a wafer, the invention offers a method and system for defining the thickness of a film introduced on a wafer. Accordingly, the invention may be practiced so as to achieve a desired concentration profile of a species, introduced by mass flow meter, having a desired concentration profile and a desired film thickness.

One application of controlling the introduction of constituents onto a semiconductor substrate to yield a graded film is in the formation of heterojunction bipolar transistors (HBTs). Bipolar transistors are utilized in a variety of applications including as amplifying and switching devices. HBTs generally offer improved performance over traditional bipolar transistors and metal oxide semiconductor (MOS) transistors in high frequency applications, particularly applications approaching 50 gigahertz (gHz). As higher frequency applications (e.g., 50 gHz or greater) become desirable, a need for improved HBTs exist. The invention contemplates improved performance of HBTs by utilizing $Si_{1-x}Ge_x$ graded junctions having optimized concentration profiles.

Figure 11:
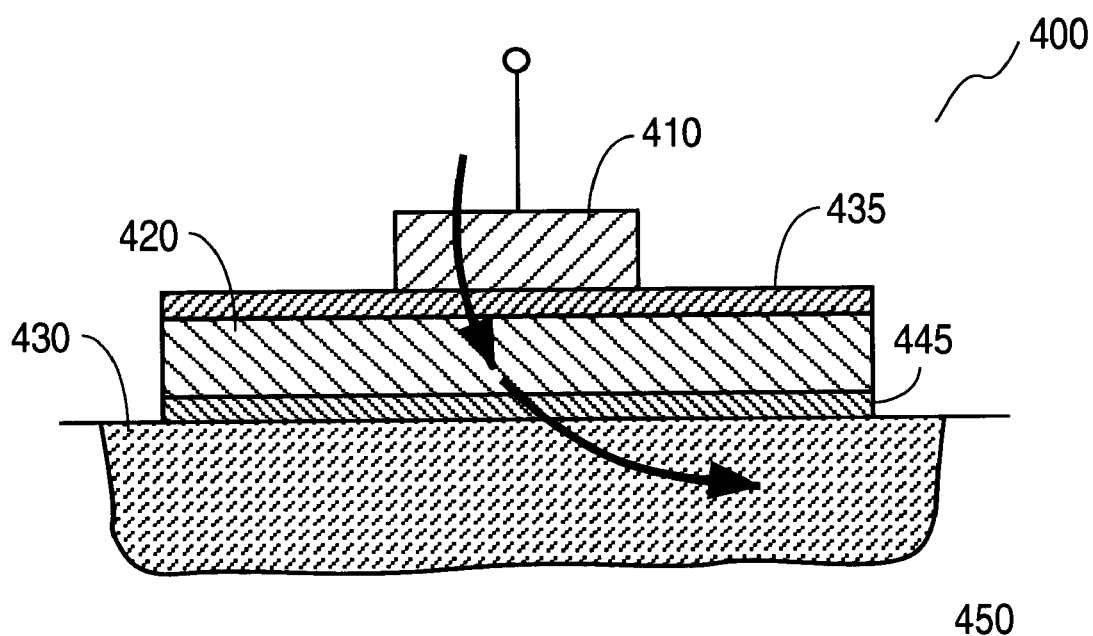
FIG. 11 schematically illustrates a heterojunction bipolar transistor formed according to an embodiment of the invention.

FIG. 11 shows a representative example of an HBT according to the invention. HBT 400 includes emitter region 410, base region 420 and collector region 430. Emitter-base (E-B) spacer 435 is positioned between emitter region 410 and base region 420. Base-collection (B-C) spacer 445 is positioned between base region 420 and collector region 430. HBT 400 is characterized by base region 420 of an epitaxially formed $Si_{1-x}Ge_x$ film as are E-B spacer 435 and B-C spacer 445. The bipolar transistor, in this embodiment, comprises N-type emitter region 410, P-type base region 420, and N-type collector region 430 (a NPN transistor). FIG. 11 illustrates the movement of electrons through transistor 400 in response to a voltage applied through electrode 450. In one example that follows, at least E-B spacer 435 will be formed with concentration gradient analagous to that shown in FIG. 9 (i.e., profile).

The use of $Si_{1-x}Ge_x$ in an HBT generally enables high-frequency performance. One of the major advantages of $Si_{1-x}Ge_x$ is a smaller energy gap than that of silicon. In unstrained bulk $Si_{1-x}Ge_x$, the energy gap drops from approximately 1.1 electron-volts (eV) in silicon to 1.0 eV for $Si_{0.8}Ge_{0.2}$. The lattice constant of $Si_{1-x}Ge_x$ is also larger than the lattice constant in silicon. If the thickness of the $Si_{1-x}Ge_x$ alloy is below a critical value, the mismatch in lattice constant is accommodated elastically, no dislocations are formed, and the $Si_{1-x}Ge_x$ film is strained. Strain lifts the degeneracy of both valence and conduction bands. As a result, the energy gap of strained $Si_{1-x}Ge_x$ decreases even more than unstrained $Si_{1-x}Ge_x$, to approximately 0.9 eV for strained $Si_{0.8}Ge_{0.2}$.

The change in the energy gap in strained $Si_{1-x}Ge_x$ film, Δ, allows for a fast transmit of charge carriers in the base region (e.g., base region 420) of HBTs under the action of the drift electric field, E:

$$E = -d\Delta/dl, \qquad (1)$$

where l is the distance across the base region. For example, the band gap reduction of 0.2 eV across a 500 Å base region, translates to a drift electric field of 40 kV/cm.

Charge carrier drift mobility, μ, through the base region of an HBT is proportional to the scattering time, τ, and inversely proportional to the effective mass of the carrier, m*:

$$\mu \sim \tau/m^*. \qquad (2)$$

The scattering time diminishes with increasing Ge concentration because of alloy scattering. The effective mass, m*, becomes anisotropic between "in-plane" and "perpendicular to the junction" directions of motion because of strain. For the perpendicular direction, the effective mass of holes is significantly smaller than $Si_{1-x}Ge_x$ due to valence band offset. The resulting hole mobility augments with the increase of x, from 450 $cm^2/Vs$ for x=0 to 1000 $cm^2/Vs$ for x=0.2 in $Si_{1-x}Ge_x$ with low dopant (i.e., P-type, N-type) concentration. The opposite trend takes place for electrons: their perpendicular mobility drops from 14000 $cm^2/Vs$ for x=0 to 750 $cm^2/Vs$ for x=0.2. Despite the decrease in the electron mobility with increasing x, the electron mobility is larger than the hole mobility over the majority of the practically useful range of the Ge concentration (i.e., x between 0 and 0.2). Accordingly, the transistor configuration of choice for high-speed applications is generally the NPN transistor because the species travelling from the emitter region to the collector region are electrons.

Typical P-type doping levels for $Si_{1-x}Ge_x$ base region 420 of NPN transistor 400 are in the $10^{18}$ $cm^{-3}$–$10^{19}$ $cm^{-3}$ range. In one aspect, this choice is generally determined by the requirement of having fairly low sheet (i.e., in-plane) resistance of base region 420. When the dopant concentration becomes large, two effects are generally thought to occur: first, the carrier perpendicular mobility is significantly reduced. For instance, for electrons, the perpendicular mobility is approximately 250 $cm^2/Vs$ and 120 $cm^2/Vs$ for doping levels of $10^{18}$ $cm^{-3}$ and $10^{19}$ $cm^{-3}$, respectively. Second, the mobility dependence on the Ge concentration is reduced: carrier mobility, μ, is almost x-independent for doping levels in the $10^{18}$ $cm^{-3}$–$10^{19}$ $cm^{-3}$ range. The effects of dopant concentration is presented in detail in the treatise *Semiconductors and Semimetals*, Vol. 56, "Germanium Silicon: Physics and Materials," edited by R. Hull and J. C. Bean, in the article by S. A. Ringel and P. N. Grillot, "Electronic Properties and Deep Levels in Ge—Si," at pages 293–346 (1999). The significant reduction in carrier mobility can be counterweighted by reducing the perpendicular size of the base (to 200Å–300 Å or thinner) and by the drift electric field (i.e., built-in potential) (see Equation 1).

The small size of base region 420 generally results in degraded overall performance of devices because of low leakage currents and reduced breakdown voltages. In order to overcome this problem, it has been suggested to use lightly doped spacers at the emitter-base and collector-base regions, e.g., E-B spacer 435 and C-B spacer 445. See Meyerson, B. S., et al., "Silicon: Germanium Heterojunction Bipolar Transistors; from Experiment to Technology,"

*Selected Topics in Electronics and Systems,* Vol. 2, "Current Trends in Heterojunction Bipolar Transistors," edited by M. F. Chang. E-B spacer 435 and C-B spacer 445 may be intrinsic (i.e., no doping) or lightly N-type doped (e.g., typically below $10^{17}$ cm$^{-3}$). As for lightly doped $Si_{1-x}Ge_x$, the electron perpendicular mobility generally depends on the Ge concentration.

If the band energy gap changes linearly, the built-in electric field is constant across the junction (Equation 1). This means that passing through the spacers, electrons spend significantly more time in the high Ge concentration regions (where their mobility is lower) than they do in the regions where the Ge concentration is lower. The invention recognizes that the overall transient time can be substantially reduced by creating a Ge concentration profile in such a way that the electric field would be higher in the regions where mobility is lower. In other words, the electric field changes in an opposite way to that of the mobility change (i.e., the electric field increases through the heterojunction if carrier mobility decreases and vice versa) to enhance the cut-off frequency of the transistor.

In one example, the transient time, $\tau$, through E-B spacer 435 is determined for the following two profiles of Ge concentration: Profile A is a linear grade, and Profile B where the electric field is inversely proportional to the electron perpendicular mobility to yield a concave gradient. As a simplification, a linear relationship between the electron drift velocity, v, and the electric field is assumed:

$$v = \mu E. \tag{3}$$

In this example, E-B spacer 435 has a thickness, W, in which the Ge concentration changes from 0 to $x_1$. The corresponding changes in the band gap and in the mobility are from $\Delta_0 = 1.1$ eV to $\Delta_1$ and from $\mu_0 = 14000$ cm$^2$/Vs to $\mu_1$. The transient time is given by the integration across base region 420 from 0 to W:

$$\tau = \int dl/v[x(l)]. \tag{4}$$

Note that the velocity is a function of x which in turn is a function of the distance, l, across base region 420.

Literature data on the band gap and mobility for x=0–0.2 can be closely approximated by the following linear relations:

$$\Delta = \Delta_0 - \alpha x, \quad \mu = \mu_0 - \beta x, \tag{5}$$

respectively, with $\alpha = 1$ eV and $\beta = 3250$ cm$^2$/Vs. For Profile A, the electric field is constant: $E = \alpha x_1/W$, mobility is $\mu = \mu_0 - (\beta x_1/W)l$, and Equation 4 is reduced to $$\tau = (W/\alpha\, x_1) \int dl/(\mu_0 - \beta^* l), \tag{6}$$

with $\beta^* = \beta x_1/W$. Integrating Equation 6, the transient time of electron carriers through E-B spacer 435 for Profile A becomes:

$$\tau_A = (W^2/\alpha \beta x_1^2)\ln(\mu_0/\mu_1). \tag{7}$$

For Profile B, the velocity is constant: $v = v_0$, and therefore $$\tau_B = W/v_0. \tag{8}$$

From Eqs. 1 and 5, we have for the electric field:

$$E = \alpha\, dx/dl. \tag{9}$$

Using Eqs. 3, 5 and 9, we obtain:

$$\alpha\, dx/dl(\mu_0 - \beta x) = v_0. \tag{10}$$

After integration Equation 9 and substitution for the transient time of electron carriers through E-B spacer 435 in Profile B becomes:

$$\tau_B = W^2/(\alpha\mu_0 x_1 - \alpha\beta x_1^2/2). \tag{11}$$

From Eqs. 9 and 11, we finally have:

$$\tau_A/\tau_B = [(\mu_0/\beta - x_1^2/2)\ln(\mu_0/\mu_1)]/x_1 \tag{12}$$

Substituting data for $x_1 = 0.15$, Equation 12 becomes: $\tau_A/\tau_B = 1.5$.

According to the above analysis, the transient time for a concentration profile according to Profile B is shorter than for the linear profile of Profile A. For Profile B, the electric field is smaller near emitter region 410 and increases towards base region 420. This change in electric field may be attributed to the band gap changing more slowly near emitter region 410 than it does near base region 420 (see Equation 1). According to Equation 5, this in turn means that for Profile B, the Ge concentration changes more slowly near emitter region 410 and faster near base region 420. In other words, moving across E-B spacer 435, the Ge profile has a concave curvature (similar to line 220 in FIG. 2) with the Ge concentration being smaller on the emitter side of E-B spacer 435 and increasing to a maximum at the interface between E-B spacer 435 and the base region.

In the above example, a NPN HBT transistor was described having a $Si_{1-x}Ge_x$ base region with an E-B spacer and a B-C spacer. The specific example described the E-B spacer. It is to be appreciated that similar beneficial results may be obtained with a similarly optimized B-C spacer, as well as an optimized base region. It is also to be appreciated that hole mobility generally increases with increasing Ge concentration (a behavior opposite to that of the electron mobility). Therefore, in the case of a PNP HBT, a convex profile (similar to line 210 of FIG. 2) of Ge concentration in a spacer will generally result in the shortest transient time and the highest cut-off frequency of PNP HBTs.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
   controlling the flow rate of a species according to a determined concentration profile of a film comprising the species introduced on a substrate; and
   introducing a film on a substrate, the film comprising the species at a first concentration at a first point in the film and a second concentration different than the first concentration at a second point in the film.

2. The method of claim 1, wherein determining the concentration profile comprises:
   determining a concentration of the species introduced on a substrate for a first plurality of flow rates;
   determining a growth rate of the species grown on a substrate for a second plurality of flow rates; and
   determining a concentration profile of the species for a unit of time.

3. The method of claim 1, wherein the introduced film comprises a thickness, the method further comprising:
   controlling the flow rate to introduce the film at a graded concentration of the species throughout the thickness of the film.

4. The method of claim 3, wherein the flow rate is controlled so that the graded concentration of the species comprises a linear gradient.

5. The method of claim 1, wherein controlling the flow rate comprises controlling the mass flow rate of the species.

6. The method of claim 1, wherein the introduction of the film on a substrate comprises introducing the species and growing the film on the substrate.

7. A method comprising:

forming a film on a substrate, the film comprising a film thickness defined between two points and a concentration profile of a species, the concentration profile varying between the two points according to a determined relationship between the species flow rate and a concentration of the species within a film.

8. The method of claim 7, wherein the concentration profile varies linearly.

9. The method of claim 7, wherein forming the film comprises introducing the species and growing the film on the substrate.

10. A method comprising generating a concentration profile specifying a concentration of a species in a film formed on a substrate by relating a species concentration in a film to a species flow rate during formation of the film.

11. The method of claim 10, wherein the concentration profile specifies a concentration in a film grown on the substrate, and generating the concentration profile further comprises relating a film growth rate to a species flow rate.

12. The method of claim 10, further comprising:

forming a film on a substrate comprising a varying concentration of the species across a thickness of the film according to the generated concentration profile.

* * * * *